(12) United States Patent
Zhang et al.

(10) Patent No.: US 9,876,019 B1
(45) Date of Patent: Jan. 23, 2018

(54) INTEGRATED CIRCUITS WITH PROGRAMMABLE MEMORY AND METHODS FOR PRODUCING THE SAME

(71) Applicant: Globalfoundries Singapore Pte. Ltd., Singapore (SG)

(72) Inventors: Xiong Zhang, Singapore (SG); Sunny Sadana, Singapore (SG); Yudi Setiawan, Singapore (SG); Yoke Leng Lim, Singapore (SG); Siow Lee Chwa, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 15/209,102

(22) Filed: Jul. 13, 2016

(51) Int. Cl.
| | |
|---|---|
| *H01L 21/02* | (2006.01) |
| *H01L 27/11521* | (2017.01) |
| *H01L 21/762* | (2006.01) |
| *H01L 29/06* | (2006.01) |
| *H01L 21/28* | (2006.01) |
| *H01L 21/311* | (2006.01) |

(Continued)

(52) U.S. Cl.
CPC .... *H01L 27/11521* (2013.01); *H01L 21/0217* (2013.01); *H01L 21/02164* (2013.01); *H01L 21/28273* (2013.01); *H01L 21/31111* (2013.01); *H01L 21/76224* (2013.01); *H01L 29/0649* (2013.01); *H01L 29/42328* (2013.01); *H01L 29/66825* (2013.01); *H01L 29/788* (2013.01)

(58) Field of Classification Search
CPC ......... H01L 27/11521; H01L 21/02164; H01L 21/0217; H01L 21/31111; H01L 21/76224; H01L 29/0649; H01L 29/66825
See application file for complete search history.

(56) References Cited

U.S. PATENT DOCUMENTS

| | | | |
|---|---|---|---|
| 8,143,662 B2 | 3/2012 | Endo et al. | |
| 2004/0014269 A1* | 1/2004 | Kim | ............ H01L 27/11521 438/201 |

(Continued)

FOREIGN PATENT DOCUMENTS

| | | |
|---|---|---|
| TW | 200505010 A | 2/2005 |
| TW | 200818194 A | 4/2008 |

(Continued)

OTHER PUBLICATIONS

Taiwan Ntellectual Property Office, Examination Report ForTaiwanese Patent Application No. 105125274 dated Jun. 15, 2017.

*Primary Examiner* — Nathan W Ha
(74) *Attorney, Agent, or Firm* — Lorenz & Kopf, LLP

(57) ABSTRACT

Methods of producing integrated circuits and integrated circuits produced by those methods are provided. In an exemplary embodiment, a method of producing an integrated circuit includes forming first and second shallow trench isolations within a substrate, where the first and second shallow trench isolations have an initial shallow trench height. A base well is formed in the substrate, where the base well is positioned between the first and second shallow trench isolations. A gate dielectric is formed overlying the base well, and a floating gate is formed overlying the gate dielectric. An initial shallow trench height is reduced to a reduced shallow trench height shorter than the initial shallow trench height after the floating gate is formed.

19 Claims, 6 Drawing Sheets

(51) Int. Cl.
*H01L 29/423* (2006.01)
*H01L 29/66* (2006.01)
*H01L 29/788* (2006.01)

(56) References Cited

U.S. PATENT DOCUMENTS

| | | | |
|---|---|---|---|
| 2007/0023815 A1* | 2/2007 | Oh | H01L 27/115 |
| | | | 257/314 |
| 2009/0065840 A1* | 3/2009 | Park | H01L 27/11521 |
| | | | 257/314 |
| 2010/0187593 A1 | 7/2010 | Morikado | |
| 2012/0299081 A1* | 11/2012 | Lee | H01L 27/11521 |
| | | | 257/316 |
| 2016/0148944 A1* | 5/2016 | Yu | H01L 27/11536 |
| | | | 438/258 |

FOREIGN PATENT DOCUMENTS

| | | |
|---|---|---|
| TW | 200947679 A | 11/2009 |
| TW | 201203468 A | 1/2012 |

\* cited by examiner

INTEGRATED CIRCUITS WITH PROGRAMMABLE MEMORY AND METHODS FOR PRODUCING THE SAME

TECHNICAL FIELD

The technical field generally relates to methods of forming memory cells and memory cells formed by such methods, and more particularly relates to methods of forming memory cells with improved program performance and memory cells produced by such methods.

BACKGROUND

The semiconductor industry is continuously moving toward the fabrication of smaller and more complex microelectronic components with higher performance. Market pressures are driving the industry to produce smaller components, but there is also significant market pressure to reduce costs and improve performance while making smaller components. Many integrated circuits include memory cells to store information, and the memory cells are becoming smaller and more complex along with other microelectronic components. There are several different types of memory cells, including flash memory that is non-volatile and re-writable. Non-volatile memory retains stored information even when the memory cell is de-powered, and stored information can be changed when a memory cell is re-writable. Some memory cells for flash memory store information by either charging or draining an electrically isolated component, and the information is recalled by determining if the isolated component is charged or not. One type of memory cell used for flash memory includes a floating gate that holds the charge. The programming performance of the memory cells can be compromised as the size of the memory cell decreases, where programming performance issues include failure of a memory cell to accept and hold an adequate charge during a program operation.

Accordingly, it is desirable to provide integrated circuits with memory cells with improved program performance over traditional memory cells, and methods for producing the same. In addition, it is desirable to provide improved memory cells using existing manufacturing processes to reduce production costs. Furthermore, other desirable features and characteristics of the present embodiment will become apparent from the subsequent detailed description and the appended claims, taken in conjunction with the accompanying drawings and this background of the invention.

BRIEF SUMMARY

Methods of producing integrated circuits and integrated circuits produced by those methods are provided. In an exemplary embodiment, a method of producing an integrated circuit includes forming first and second shallow trench isolations within a substrate, where the first and second shallow trench isolations have an initial shallow trench height. A base well is formed in the substrate, where the base well is positioned between the first and second shallow trench isolations. A gate dielectric is formed overlying the base well, and a floating gate is formed overlying the gate dielectric. An initial shallow trench height is reduced to a reduced shallow trench height shorter than the initial shallow trench height after the floating gate is formed.

A method of producing an integrated circuit is provided in another embodiment. The method includes forming first and second shallow trench isolations within a substrate, and forming a base well in the substrate where the base well is positioned between the first and second shallow trench isolations. A gate dielectric is formed overlying the base well, and a floating gate is formed overlying the gate dielectric. The floating gate has a side surface with an exposed surface area, and the exposed surface area of the side surface is increased after forming the floating gate.

An integrated circuit is provided in yet another embodiment. The integrated circuit includes a substrate with a substrate bottom surface. First and second shallow trench isolations are disposed within the substrate, where the first shallow trench isolation includes a first top surface at a reduced shallow trench height measured from the substrate bottom surface. A base well within the substrate is disposed between the first and second shallow trench isolations, and a gate dielectric overlies the base well. A floating gate overlies the gate dielectric, where the floating gate has a floating gate lowest point at a floating gate bottom height measured from the substrate bottom surface. The reduced shallow trench height is greater than the floating gate bottom height by from about 200 angstroms to about 10 angstroms.

BRIEF DESCRIPTION OF THE DRAWINGS

The present embodiments will hereinafter be described in conjunction with the following drawing figures, wherein like numerals denote like elements, and wherein:

FIGS. 1-11 illustrate exemplary embodiments of an integrated circuit and methods for its production, wherein FIG. 1 is a perspective view, FIGS. 2-7 are cross sectional views taken along plane A-A of FIG. 1, and FIGS. 8-11 are cross sectional views taken along plane B-B of FIG. 1.

DETAILED DESCRIPTION

The following detailed description is merely exemplary in nature and is not intended to limit the various embodiments or the application and uses thereof. Furthermore, there is no intention to be bound by any theory presented in the preceding background or the following detailed description. Embodiments of the present disclosure are generally directed to integrated circuits and methods for fabricating the same. The various tasks and process steps described herein may be incorporated into a more comprehensive procedure or process having additional steps or functionality not described in detail herein. In particular, various steps in the manufacture of integrated circuits are well-known and so, in the interest of brevity, many conventional steps will only be mentioned briefly herein or will be omitted entirely without providing the well-known process details.

Methods for forming flash memory cells according to various embodiments are provided herein. One embodiment of flash memory cell structure includes a floating gate overlying a portion of the substrate that is between adjacent shallow trench isolations. A flash dielectric and a control gate blanket the floating gate in one direction, so the control gate overlies the floating gate and is also adjacent to an exposed side surface of the floating gate. A portion of the side surface of the floating gate is ordinarily covered by the shallow trench isolation, and this reduces a control gate to floating gate coupling ratio because the covered side surface area would otherwise be adjacent to the control gate in accordance with embodiments described herein. The shallow trench isolation is recessed after the floating gate is formed to increase the exposed side surface area. The control gate is formed later, so the recess of the shallow trench isolation increases the control gate to floating gate coupling ratio, and this increased coupling ratio provides improved program performance for the memory cell.

Figure 1:
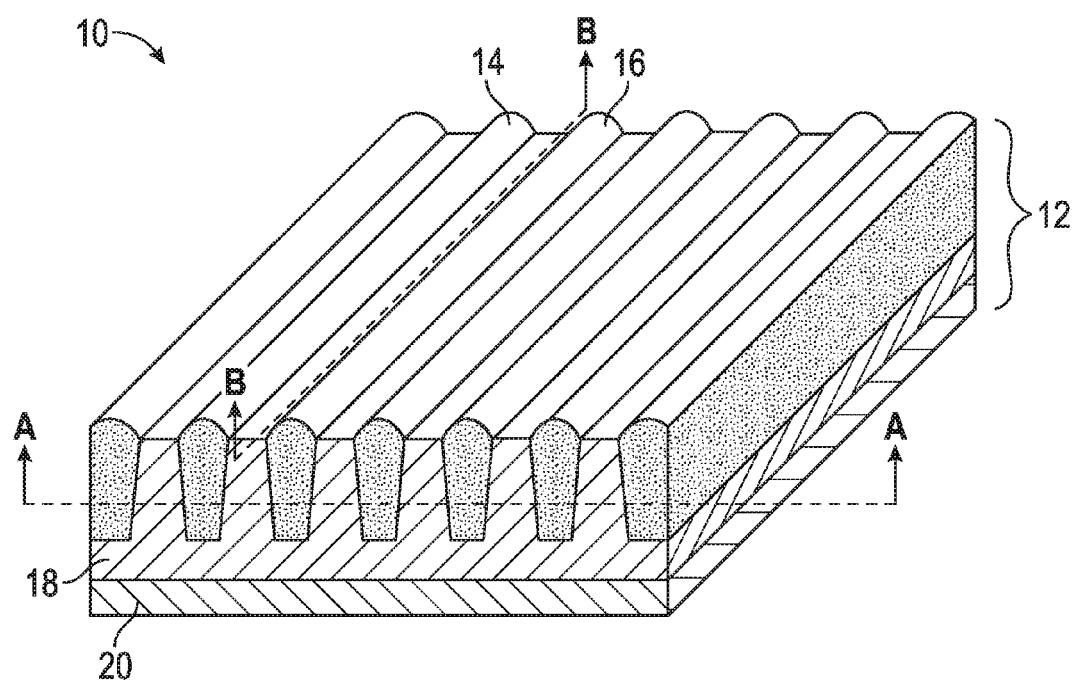

Reference is made to an exemplary embodiment in FIG. 1. An integrated circuit 10 includes a substrate 12 including semiconductor material. As used herein, the term "semiconductor material" will be used to encompass semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. As referred to herein, a material that includes a recited element/compound includes the recited element/compound in an amount of at least 10 weight percent or more based on the total weight of the material unless otherwise indicated. In many embodiments, the substrate 12 primarily includes a monocrystalline semiconductor material. The substrate 12 may be a bulk silicon wafer (as illustrated) or may be a thin layer of silicon on an insulating layer (commonly known as silicon-on-insulator or SOI, not illustrated) that, in turn, is supported by a carrier wafer.

In embodiments and as shown in FIG. 1, one or more shallow trench isolations are formed in the substrate 12, including a first shallow trench isolation 14 and an adjacent second shallow trench isolation 16. In an embodiment where the shallow trench isolation has a closed shape when viewed from above, such as a box, the first and second shallow trench isolations 14, 16 refer to opposite branches of the closed shallow trench isolation structure. The shallow trench isolations are formed of electrically insulating materials, and may include silicon dioxide in an exemplary embodiment. As used herein, an "electrically insulating material" is a material with a resistivity of about $1 \times 10^4$ ohm meters or more, and an "electrically conductive material" is a material with a resistivity of about $1 \times 10^{-4}$ ohm meters or less. The first and second shallow trench isolations 14, 16 may extend essentially parallel to each other for some length within the substrate 12. The first and second shallow trench isolations 14, 16 can be formed by any suitable techniques. In an exemplary embodiment, STI trenches (not illustrated) can be patterned using lithography and etched into the substrate 12, such as with an anisotropic reactive ion etch using carbon tetrafluoride and hydrofluoric acid. The STI trench (not illustrated) can then be filled with an electrically insulating material such as silicon dioxide, which can be deposited by chemical vapor deposition using silane and oxygen. Overburden may then be removed by chemical mechanical planarization to produce the plurality of shallow trench isolations. The surface of the substrate 12 between the first and second shallow trench isolations 14, 16 may be more readily removed by chemical mechanical planarization, so the first and second shallow trench isolations 14, 16 (and other shallow trench isolations) may extend above the surface of the substrate 12 to some extent. For example, the first and second shallow trench isolations 14, 16 may extend over the surface of the substrate 12 by from about 500 angstroms to about 1,000 angstroms, but other distances are also possible.

A base well 18 may be formed within the substrate 12 between the first and second shallow trench isolations 14, 16, (and between other shallow trench isolations) and a deep well 20 may be formed underlying the base well 18. The first and second shallow trench isolations 14, 16 are described herein with the understanding that the first and second shallow trench isolations 14, 16 are exemplary embodiments for other shallow trench isolations within the integrated circuit 10. The base well 18 may also extend under the first and second shallow trench isolations 14, 16 to some extent. In an exemplary embodiment, the base well 18 is a P well that includes "P" type conductivity determining impurities, and the deep well 20 is an N well that includes "N" type conductivity determining impurities, but the reverse type wells are also possible in alternate embodiments. In an exemplary embodiment, the base well 18 and deep well 20 are formed by implanting "P" and "N" type conductivity determining ions into the substrate 12, where the depth of the implant is controlled by the energy used for the ion implantation process. The "N" type conductivity determining ions primarily include ions of phosphorous, arsenic, and/or antimony, but other materials could also be used. "P" type conductivity determining ions primarily include boron, aluminum, gallium, and indium, but other materials could also be used. Ion implantation involves ionizing the conductivity determining material and propelling the ion into the substrate 12 under the influence of an electrical field. The base well 18 and the deep well 20 may then be annealed to repair crystal damage from the ion implantation process, to electrically activate the conductivity determining impurities (sometimes referred to as "dopants,") and to redistribute the conductivity determining materials within the semiconductor material. The annealing process can use widely varying temperatures, such as temperatures ranging from about 500 degrees centigrade (° C.) to about 1,200° C. The base well 18 and/or the deep well 20 may be formed prior to the plurality of shallow trench isolations in some embodiments, but they may also be formed after the shallow trench isolations.

Figure 2:
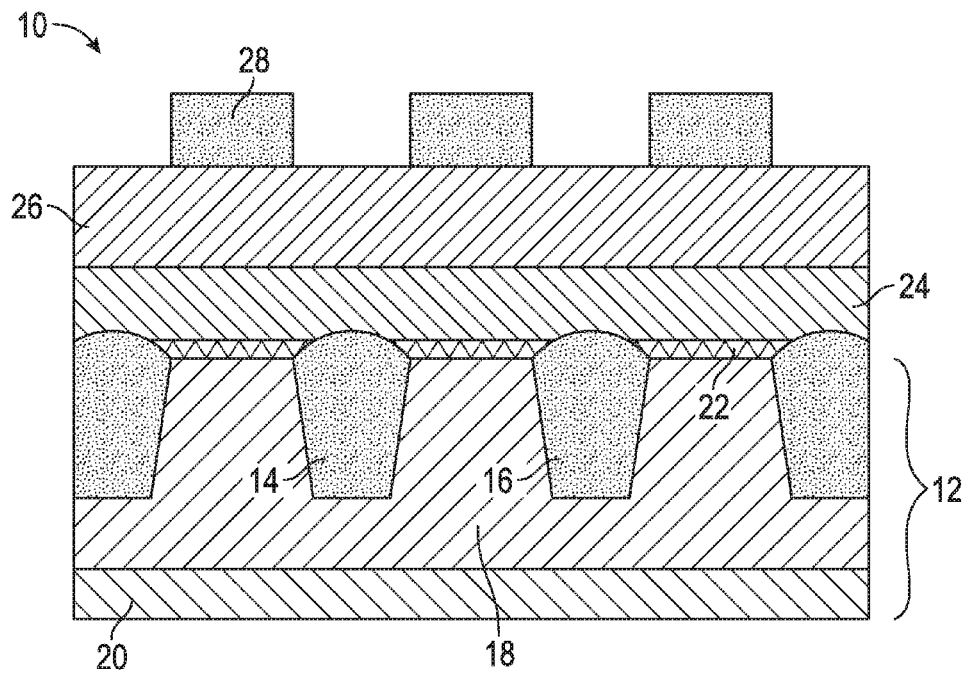

Reference is made to the exemplary embodiment in FIG. 2, where FIGS. 2-7 are taken along line A-A from FIG. 1. A gate dielectric 22 is formed overlying the base well 18, where the gate dielectric 22 includes an electrically insulating material. The gate dielectric 22 may be formed by thermally oxidizing the surface of the base well 18 in an exemplary embodiment, but the gate dielectric 22 may be deposited or otherwise formed in alternate embodiments. As such, the gate dielectric 22 is silicon dioxide in an exemplary embodiment, but other electrically insulating materials may be used in alternate embodiments. As used herein, the term "overlying" means "over" such that an intervening layer may lie between the gate dielectric 22 and the base well 18, or "on" such that the gate dielectric 22 physically contacts the base well 18.

A floating gate layer 24 may then be formed overlying the gate dielectric 22 and the first and second shallow trench isolations 14, 16. The floating gate layer 24 may include polysilicon with conductivity determining ions, but other materials that are suitable for electron storage as a floating gate within a memory cell are also possible. Polysilicon can be deposited by low pressure chemical vapor deposition in a silane environment, and the desired conductivity determining impurities may be included at the appropriate concentration. Lithography may then be used to pattern the floating gate layer 24. In the illustrated embodiment, a floating gate hard mask 26 is formed overlying the floating gate layer 24, and a floating gate photoresist 28 is formed and patterned over the floating gate hard mask 26. In an exemplary embodiment, the floating gate hard mask 26 is a spin-on hard mask, such as an organic dielectric material. Spin-on organic dielectric hard mask materials are commercially available, and may be based on various chemistries, such as fullerene compounds or compounds with aryl groups having hydroxyl and/or carboxylic functional groups. The spin-on organic hard mask materials may be cured after spin coating, such as by heating to about 220 to about 400° C. The floating gate photoresist 28 (and other photoresist layers described below) may be deposited by spin coating, and patterned by exposure to light or other electromagnetic radiation through a mask with transparent sections and opaque sections. The light causes a chemical change in the photoresist such that either the exposed portion or the non-exposed portion can be selectively removed. The desired locations may be removed with an organic solvent, and the floating gate photoresist 28 remains overlying the other areas of the floating gate hard mask 26 (or other components for photoresist layers described below).

Figure 3:
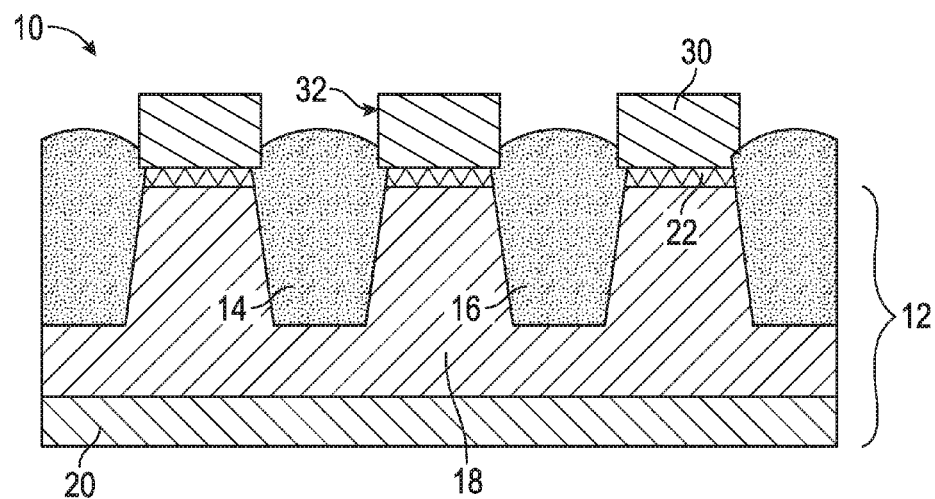

The floating gate layer 24 is patterned with the floating gate photoresist 28 to form a floating gate 30, as illustrated in an exemplary embodiment in FIG. 3 with continuing reference to FIG. 2. The floating gate hard mask 26 and the floating gate layer 24 may be patterned with the floating gate photoresist 28 using an anisotropic etch, such as with a reactive ion etch using hydrogen bromide or difluoro methane. The floating gate 30 has a side surface 32 with a side surface area, where a portion of the side surface 32 is covered by the first shallow trench isolation 14. As mentioned above, the first and second shallow trench isolations 14, 16 may extend above the surface of the base well 18 because of different removal rates during chemical mechanical planarization when the first and second shallow trench isolations 14, 16 were formed. Other portions of other side surfaces 32 are covered by other shallow trench isolations, where this description for the side surface 32 and the first shallow trench isolation 14 is also applicable for other of the plurality of shallow trench isolations. The portion of the side surface 32 that is not covered by the first shallow trench isolation 14 is an exposed portion of the side surface 32, and this exposed portion has an exposed surface area.

Figure 4:
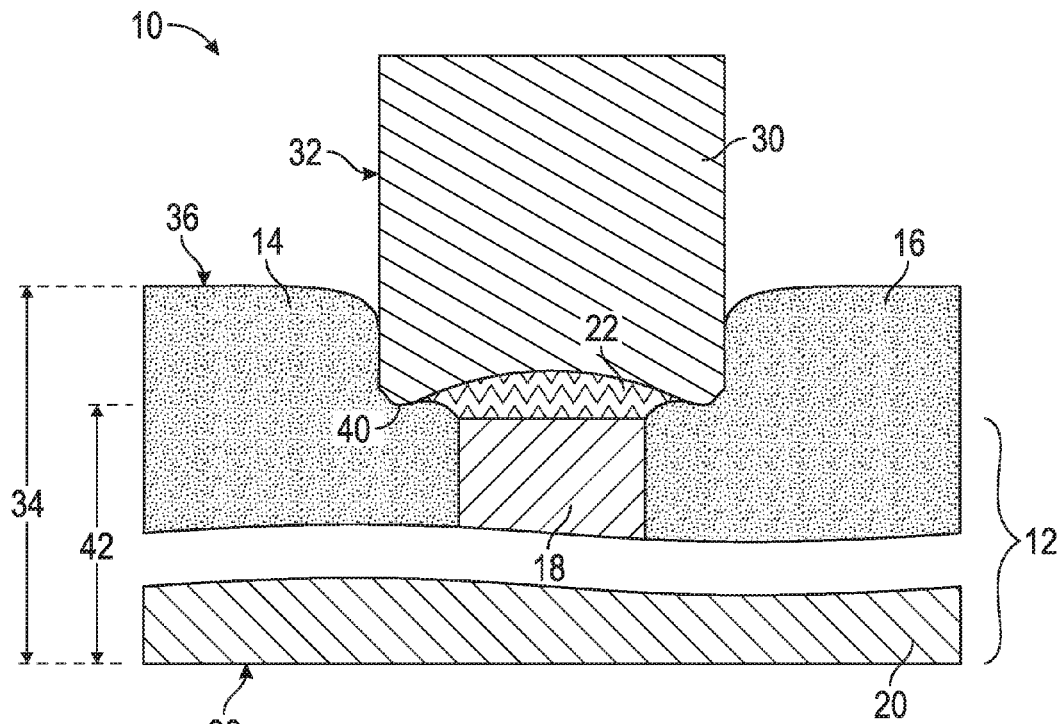
Figure 5:
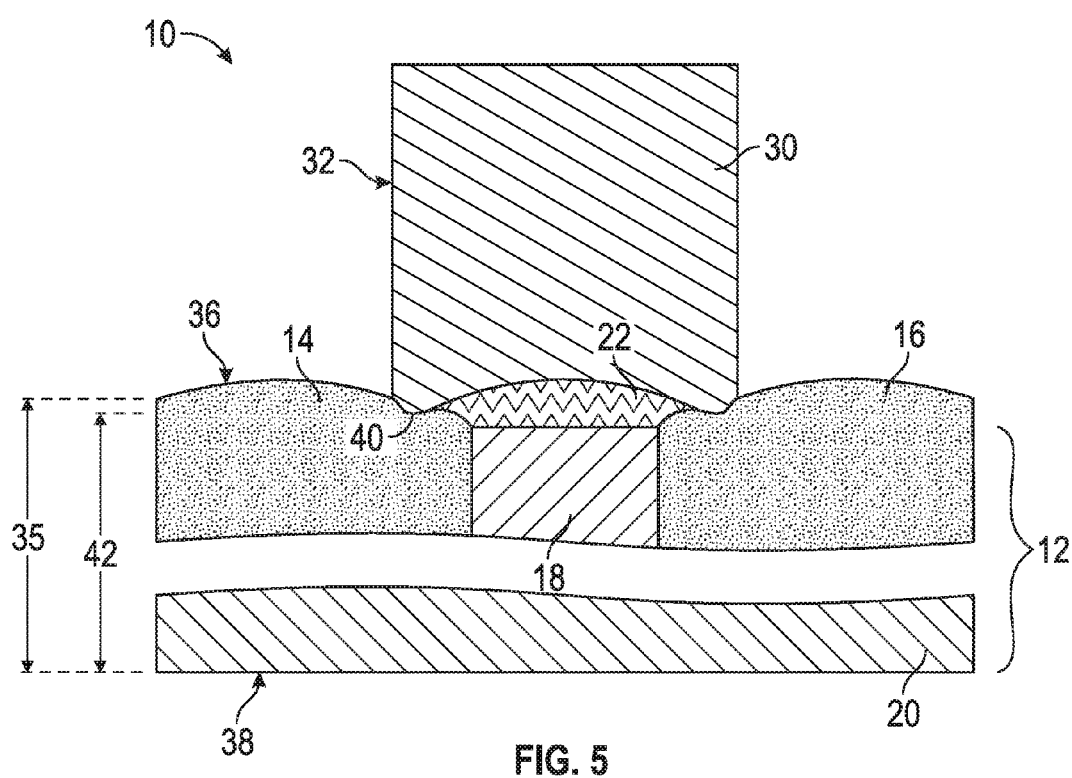

Referring to an exemplary embodiment in FIGS. 4 and 5, the floating gate 30 is illustrated in greater detail. The first shallow trench isolation 14 (and other shallow trench isolations) may be reduced in height to increase the exposed surface area of the side surface 32, where FIG. 4 illustrates the integrated circuit 10 before the height reduction and FIG. 5 illustrates the integrated circuit 10 after the height reduction. In an exemplary embodiment where the first shallow trench isolation 14 includes silicon dioxide, the first shallow trench isolation 14 may be selectively reduced in height with a wet etch using dilute hydrofluoric acid. The first and second shallow trench isolations 14, 16 has an initial shallow trench height 34 measured from a first top surface 36 of the first shallow trench isolation 14 to a substrate bottom surface 38. Reducing the initial shallow trench height 34 increases the exposed surface area of the side surface 32, because the portion of the side surface 32 that was covered by the first and second shallow trench isolations 14, 16 is no longer covered. In an exemplary embodiment, the initial shallow trench height 34 is reduced after the floating gate 30 is formed to a second floating gate height 35 that is shorter than the initial shallow trench height 34. The reduced shallow trench height 35 is shorter than the initial shallow trench height 34 by from about 50 to about 300 angstroms (Å), or from about 100 to about 250 Å, or from about 150 to about 200 Å in various embodiments. In an exemplary embodiment, the initial shallow trench height 34 is reduced after the floating gate 30 is formed, in part because the floating gate 30 follows the profile of the available space when formed. Therefore, the shape of the floating gate 30 could be different than desired if the initial shallow trench height 34 were reduced before the formation of the floating gate 30.

The floating gate 30 has a floating gate lowest point 40 with a floating gate bottom height 42 measured from the floating gate lowest point 40 to the substrate bottom surface 38. The reduction of the initial shallow trench height 34 to produce the reduced shallow trench height 35 may be optimized to increase the exposed surface area of the side surface 32 of the floating gate 30 without exposing the floating gate lowest point 40. If the initial shallow trench height 34 is reduced too much, the performance of the memory cell deteriorates as charge leakage increases, where the charge leakage may be from the control gate (illustrated in FIG. 5, discussed below) to the substrate 12 through the base well 18. For example, if the reduced shallow trench height 35 is reduced to expose the floating gate lowest point 40, increased leakage may be observed. As such, the reduced shallow trench height 35 may be greater than the floating gate bottom height 42 by about 10 Å or more. For example, the reduced shallow trench height 35 may be from about 300 Å to about 10 Å, or from about 200 Å to about 10 Å, or from about 100 Å to about 10 Å greater than the floating gate bottom height 42 in various embodiments.

The wet etch with dilute hydrofluoric acid described above may be performed without the use of a mask or lithography because the dilute hydrofluoric acid may have a negligible or very slow etch rate of integrated circuit materials other than the silicon dioxide that may be present in the plurality of shallow trench isolations. As such, the wet etch has little effect other than to lower the initial shallow trench height 34 (and related shallow trench heights.) An additional benefit of the wet etch process is the cost, because the wet etch is a low cost process. The etch may be performed at room temperature, and may use dilute hydrofluoric acid that will reduce the initial shallow trench height 34 at a rate of about 1 Å per minute. Other wet etch processes may be used in alternate embodiments, such as where materials other than silicon dioxide are present in the first and second shallow trench isolations 14, 16.

Figure 6:
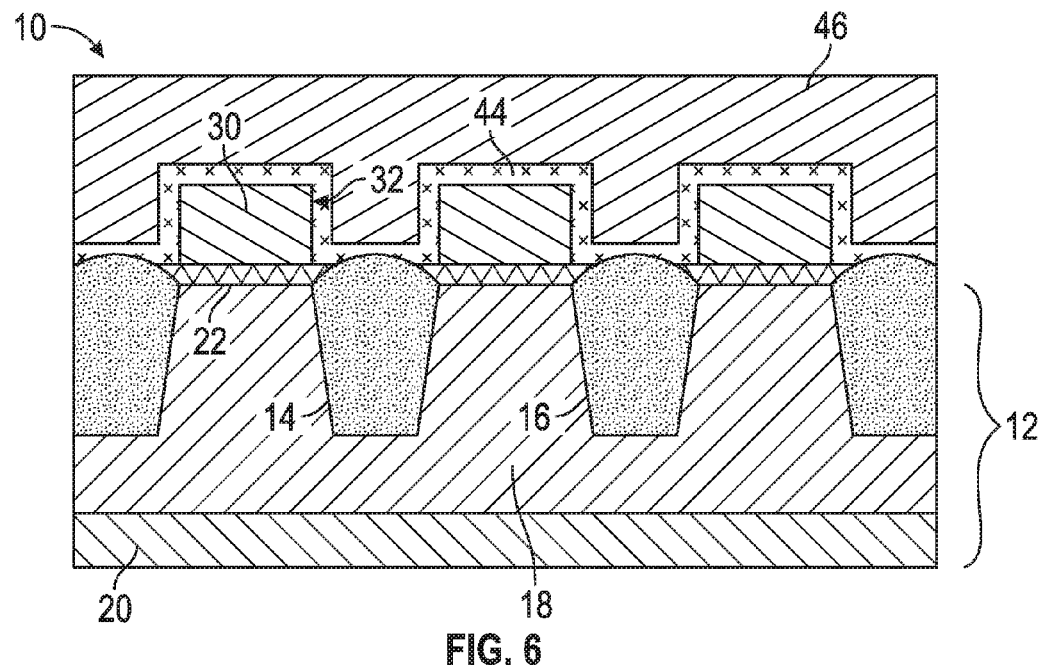
Figure 7:
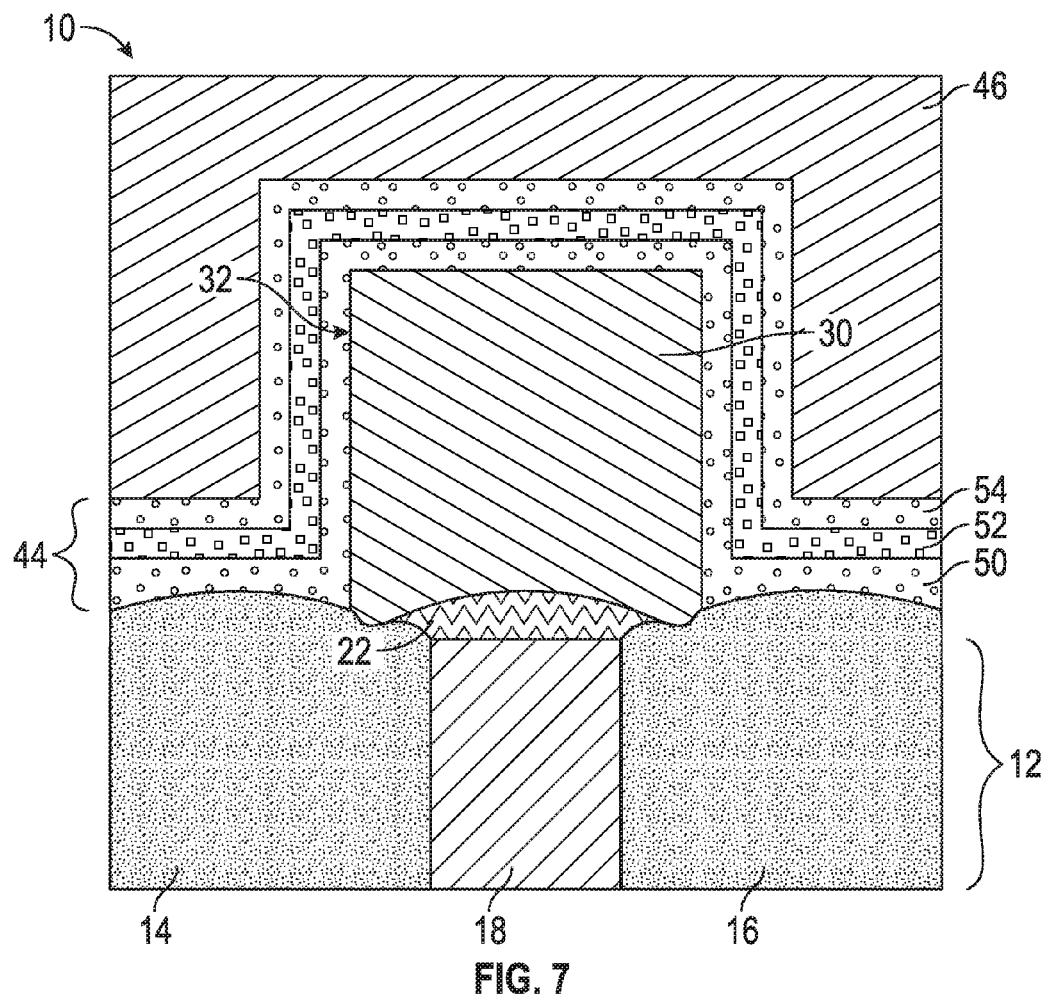

Referring to an exemplary embodiment illustrated in FIG. 6, a flash dielectric 44 is formed overlying the floating gate 30 and the first and second shallow trench isolations 14, 16, after the initial shallow trench height 34 is reduced to the reduced shallow trench height 35, as described above. A control gate 46 may then be formed overlying the flash dielectric 44. In an exemplary embodiment illustrated in FIG. 7, with continuing reference to FIG. 6, the flash dielectric 44 includes at least three different layers that are sequentially deposited. For example, the flash dielectric 44 may include a first flash dielectric layer 50 that includes silicon dioxide, a second flash dielectric layer 52 that includes silicon nitride, and a third flash dielectric layer 54 that includes silicon dioxide to form what may be called an ONO (oxide, nitride, oxide) flash dielectric 44. Silicon dioxide may be formed by chemical vapor deposition using silane and oxygen, and silicon nitride may be formed by chemical vapor deposition using ammonia and dichlorosilane. The control gate 46 may include polysilicon with conductivity determining impurities, which can be formed by low pressure chemical vapor deposition in a silane environment. The reduced shallow trench height 35 increased the exposed surface area of the side surface 32 of the floating gate 30, as described above, and this increased area serves to increase a control gate to floating gate coupling ratio. The control gate to floating gate coupling ratio is the ratio of: 1) the surface area of the floating gate 30 that is directly covered by the control gate 46 compared to 2) the total surface area of the floating gate 30 (where the total surface area of the floating gate 30 includes the surface area contacting the gate dielectric 22.) The area of the floating gate 30 directly covered by the control gate 46 is the area where a theoretical line perpendicular to the surface of the floating gate 30 passes through the flash dielectric 44 and contacts the control gate 46. After the reduction of the initial shallow trench height 34 to the reduced shallow trench height 35 and the formation of the control gate 46, the control gate to floating gate coupling ratio may be up to about 70% in some embodiments. Increases in the control gate to floating gate coupling ratio generally improve memory cell program performance.

Figure 8:
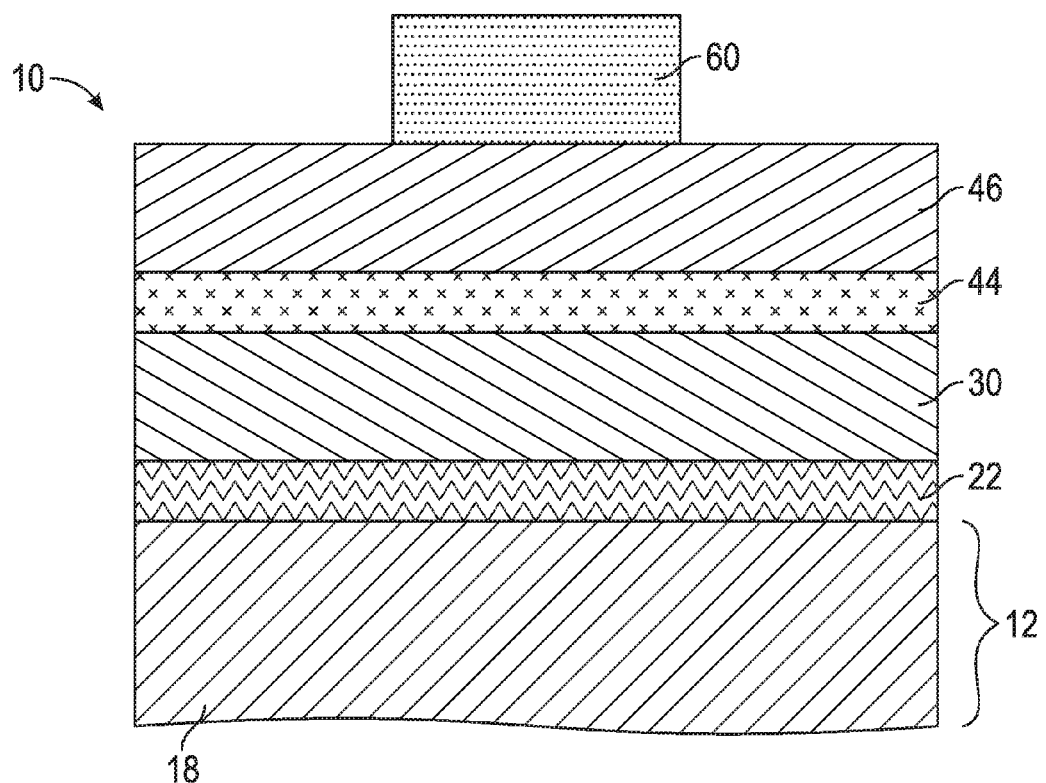
Figure 9:
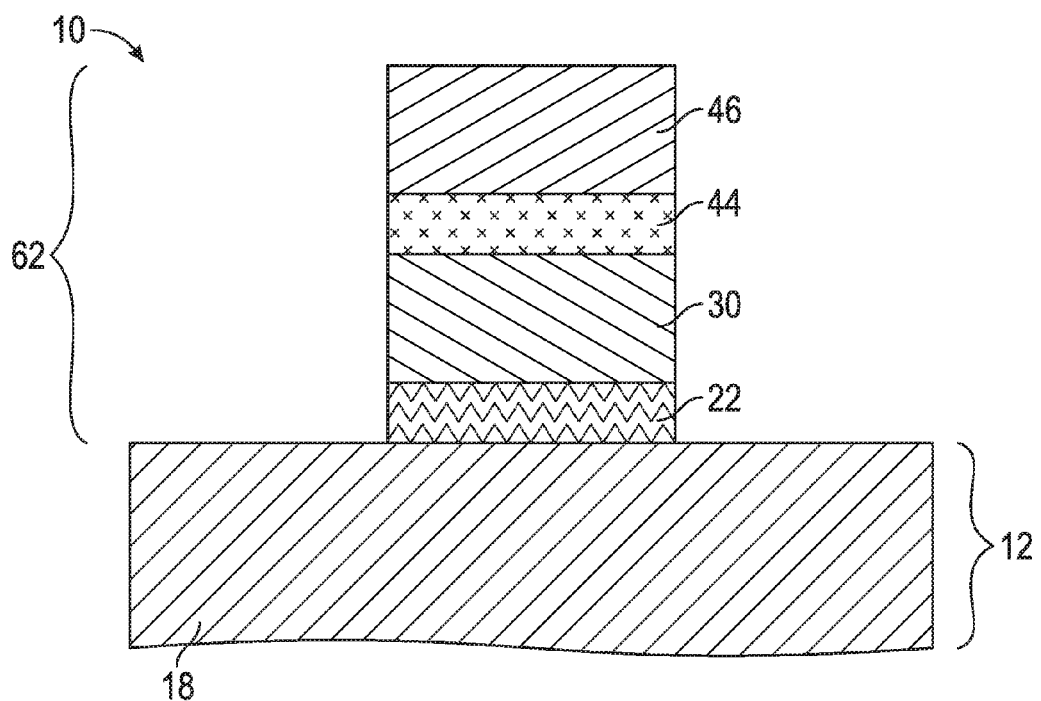

Reference is made to FIG. 8, where FIGS. 8-11 are taken along line B-B from FIG. 1. A select photoresist 60 is formed and patterned overlying the control gate 46, the flash dielectric 44 (illustrated as a single layer for simplicity), the floating gate 30, the gate dielectric 22, and the base well 18. The select photoresist 60 may include an anti-reflective coating and/or a hard mask (not illustrated) in various embodiments. FIG. 9, with continuing reference to FIG. 8, illustrates a stack 62 formed by removal of the control gate 46, the flash dielectric 44, the floating gate 30, and the gate dielectric 22 exposed by the patterned select photoresist 60. The layers can be removed with one or more reactive ion etches selective to the material of the layers being removed.

Figure 10:
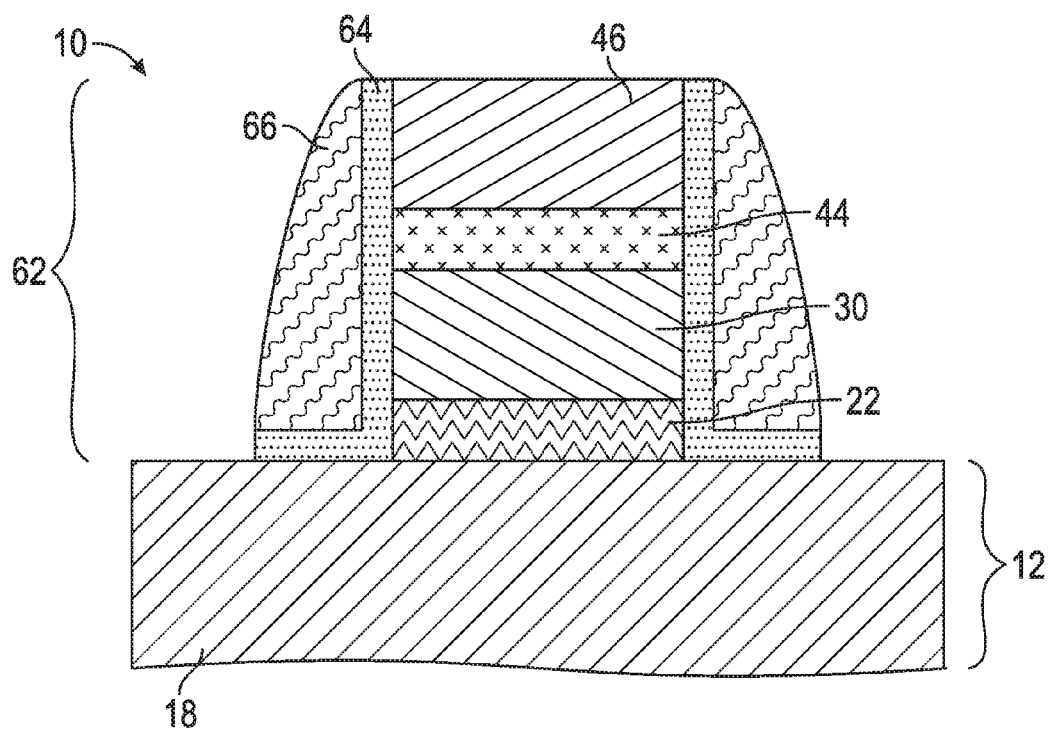

A select dielectric 64 and a select gate 66 may then be formed adjacent to the stack 62, as illustrated in an exemplary embodiment in FIG. 10. As such, the select dielectric 64 and the select gate 66 are adjacent to the floating gate 30 and the control gate 46, where the select dielectric 64 is positioned between the select gate 66 and each of the floating gate 30 and the control gate 46. The select dielectric 64 may include silicon dioxide, and the select gate 66 may include polysilicon and conductivity determining impurities, which may be formed as described above. The select dielectric 64 and select gate 66 may be formed by blanket depositing the desired materials and performing an anisotropic reactive ion etch that removes the horizontal portions more readily than vertical portions such that the select dielectric 64 and the select gate 66 are formed similar to spacers adjacent to the stack 62.

Figure 11:
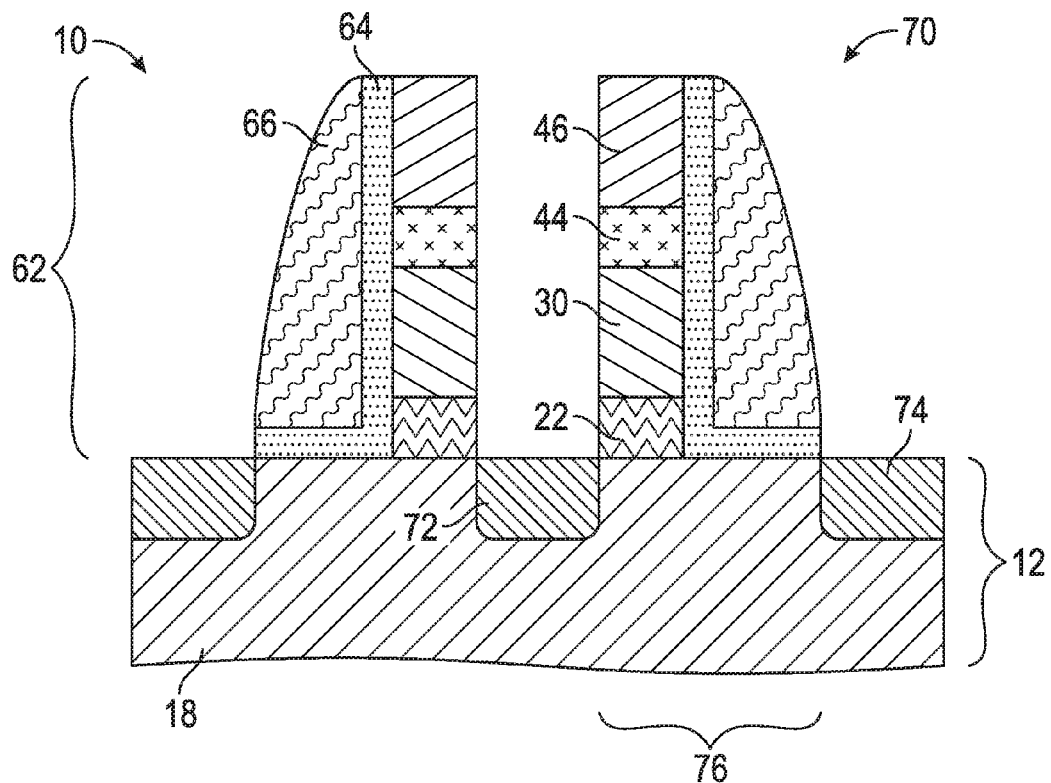

FIG. 11 illustrates two adjacent exemplary memory cells 70, with continuing reference to FIG. 10. A center portion of the stack 62 may be removed using lithography and a reactive ion etch. A drain 72 and sources 74 may be formed in the base well 18 by ion implantation, as described above, where the drain 72 may be used for both of the adjacent memory cells 70. The source 74 and drain 72 may include "N" or "P" type conductivity determining impurities in various embodiments, where the predominant conductivity determining impurities in the source 74 and drain 72 are different than the predominant conductivity determining impurity in the base well 18. A channel 76 is defined within the base well 18 of the substrate 12 between the source 74 and drain 72, where the channel 76 underlies the floating gate 30 and the select gate 66. The channel 76 may also underlie the select gate 66, or at least a portion of the select gate 66. The memory cells 70 may then be incorporated into the integrated circuit 10 with bit lines and word lines (not illustrated).

The relatively simple and inexpensive reduction of the initial shallow trench height 34 for the plurality of shallow trench isolations may be used to improve program performance of the memory cell 70 by increasing the control gate to floating gate coupling ratio. This height reduction is easy to incorporate into many integrated circuit manufacturing processes, and has a relatively low cost.

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration of the application in any way. Rather, the foregoing detailed description will provide those skilled in the art with a convenient road map for implementing one or more embodiments, it being understood that various changes may be made in the function and arrangement of elements described in an exemplary embodiment without departing from the scope, as set forth in the appended claims.

What is claimed is:

1. A method of producing an integrated circuit comprising:
    forming a first shallow trench isolation and a second shallow trench isolation within a substrate, wherein the first shallow trench isolation comprises an initial shallow trench height;
    forming a base well in the substrate, wherein the base well is positioned between the first shallow trench isolation and the second shallow trench isolation;
    forming a gate dielectric overlying the base well;
    forming a floating gate overlying the gate dielectric, where the floating gate comprises a side surface, and where a portion of the side surface is covered by the first shallow trench isolation and an exposed portion of the side surface is exposed; and
    reducing the initial shallow trench height to a reduced shallow trench height shorter than the initial shallow trench height after forming the floating gate.

2. The method of claim 1 wherein reducing the initial shallow trench height comprises exposing the first shallow trench isolation to a wet etch.

3. The method of claim 1 wherein the exposed portion of the side surface of the floating gate is not covered by the first or second shallow trench isolation.

4. The method of claim 1 further comprising:
    forming a flash dielectric overlying the floating gate and the first shallow trench isolation.

5. The method of claim 4 wherein forming the flash dielectric comprises forming the flash dielectric comprising a first flash dielectric layer, a second flash dielectric layer, and a third flash dielectric layer.

6. The method of claim 5 wherein forming the flash dielectric comprises forming the first flash dielectric layer comprising silicon dioxide, forming the second flash dielectric layer comprising silicon nitride, and forming the third flash dielectric layer comprising silicon dioxide.

7. The method of claim 1 wherein reducing the initial shallow trench height comprises reducing the initial shallow trench height by from about 50 angstroms to about 300 angstroms.

8. The method of claim 1 further comprising:
    forming a select gate overlying the substrate and adjacent to the floating gate.

9. The method of claim 8 further comprising:
forming a source in the substrate;
forming a drain in the substrate, wherein a channel is defined within the substrate between the source and the drain, and wherein the select gate and the floating gate overlie the channel.

10. The method of claim 1 further comprising:
optimizing the reduced shallow trench height.

11. The method of claim 1 wherein:
reducing the initial shallow trench height comprises reducing the initial shallow trench height to the reduced shallow trench height, wherein the initial shallow trench height and the reduced shallow trench height are measured from a first top surface of the first shallow trench isolation to a substrate bottom surface; and
forming the floating gate comprises forming the floating gate with a floating gate bottom height measured from a floating gate lowest point to the substrate bottom surface, and wherein the reduced shallow trench height is from about 10 angstroms to about 200 angstroms greater than the floating gate bottom height.

12. A method of producing an integrated circuit comprising:
forming a first shallow trench isolation and a second shallow trench isolation within a substrate;
forming a base well in the substrate, wherein the base well is positioned between the first shallow trench isolation and the second shallow trench isolation;
forming a gate dielectric overlying the base well;
forming a floating gate overlying the gate dielectric, wherein the floating gate has a side surface with an exposed surface area, and wherein a portion of the side surface is covered by the first shallow trench isolation; and
increasing the exposed surface area of the side surface after forming the floating gate.

13. The method of claim 12 further comprising:
forming a flash dielectric overlying the first shallow trench isolation and the floating gate.

14. The method of claim 13 further comprising forming a control gate overlying the flash dielectric.

15. The method of claim 14 wherein increasing the exposed surface area of the side surface comprises increasing a control gate to floating gate coupling ratio.

16. The method of claim 14 further comprising:
forming a select gate overlying the substrate, wherein the select gate is adjacent to the floating gate and the select gate is adjacent to the control gate.

17. The method of claim 16 further comprises:
forming a source and a drain in the substrate such that a channel is defined in the substrate between the source and the drain, wherein the select gate and the floating gate overlie the channel.

18. The method of claim 12 wherein increasing the exposed surface area of the side surface comprises reducing an initial shallow trench height.

19. The method of claim 12 wherein the exposed surface area is a surface area of an exposed portion of the side surface of the floating gate that is not covered by the first or second shallow trench isolation.

* * * * *